United States Patent
Fang et al.

(10) Patent No.: US 8,982,921 B2
(45) Date of Patent: Mar. 17, 2015

(54) SEMICONDUCTOR LASERS AND ETCHED-FACET INTEGRATED DEVICES HAVING H-SHAPED WINDOWS

(71) Applicant: Avago Technologies General IP (Singapore) Pte. Ltd., Singapore (SG)

(72) Inventors: Ruiyu Fang, Turin (IT); Giammarco Rossi, Turin (IT); Alessandro Stano, Turin (IT); Giuliana Morello, Turin (IT); Paola-Ida Gotta, Turin (IT); Roberto Paoletti, Turin (IT); Pietro Della Casa, Mantova (IT); Giancarlo Meneghini, Turin (IT)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/761,911

(22) Filed: Feb. 7, 2013

(65) Prior Publication Data

US 2014/0219305 A1    Aug. 7, 2014

(51) Int. Cl.
*H01S 5/00*    (2006.01)
*H01L 33/46*    (2010.01)
*H01S 5/16*    (2006.01)
*H01S 5/20*    (2006.01)

(52) U.S. Cl.
CPC . *H01L 33/46* (2013.01); *H01S 5/16* (2013.01); *H01S 5/20* (2013.01)
USPC .................. 372/45.01; 372/49.01; 438/31

(58) Field of Classification Search
CPC ............... H01S 5/16; H01S 5/20; H01S 5/22; H01S 5/34; H01L 33/46
USPC .......................... 372/39, 43.01, 45.01, 49.01
See application file for complete search history.

(56) References Cited

U.S. PATENT DOCUMENTS

| | | | |
|---|---|---|---|
| 2008/0191223 A1 | 8/2008 | Nakamura et al. |
| 2011/0080929 A1 | 4/2011 | Onozawa et al. |
| 2012/0183007 A1 | 7/2012 | Roggero et al. |
| 2012/0195336 A1 | 8/2012 | Fang et al. |

OTHER PUBLICATIONS

Kawaguchi, et al., "A GaN-based surface-emitting laser with 45°-inclined mirror in horizontal-cavity," Proc. of SPIE vol. 6909, 69090F (2008).

(Continued)

*Primary Examiner* — Armando Rodriguez

(57) ABSTRACT

An edge-emitting optical semiconductor structure has a substrate, an active multiple quantum well (MQW) region formed on the substrate, and a ridge waveguide extending between first and second etched end facets. The first etched end facet is disposed in a first window, while the second etched end facet is disposed in a second window. The first etched end facet extends between a pair of alcoves in the first window, and the second etched end facet extends between a pair of alcoves in the second window. An integrated device in which two such structures are provided has an H-shaped window where the two structures adjoin each other. The structure can be fabricated using a process that involves a first mask to form the ridge waveguide and then a second mask and an etching process to form the windows.

20 Claims, 13 Drawing Sheets

(56) References Cited

OTHER PUBLICATIONS

Vettiger, et al., "Full-Wafer Technology—A New Approach to Large-Scale Laser Fabrication and Integration," IEEE Journal of Quantum Electronics, vol. 27(6), Jun. 1991, pp. 1319-1331.

Horst, et al., "High-Reflectance Dielectric Mirrors Deposited by Plasma-Enhanced Chemical Vapor Deposition on GaAs—AlGaAs Semiconductor Lasers with Inductively Coupled Plasma Etched Facets," IEEE Photonics Technology Letters, vol. 12(10), Oct. 2000, pp. 1325-1327.

SEMICONDUCTOR LASERS AND ETCHED-FACET INTEGRATED DEVICES HAVING H-SHAPED WINDOWS

BACKGROUND

Optical transceivers are key components in optical fiber-based telecommunications and data communication networks. An optical transceiver includes an opto-electronic light source, such as a laser, and an opto-electronic light receiver, such as a photodiode, and may also include various electronic circuitry associated with the laser and photodiode. For example, driver circuitry can be included for driving the laser in response to electronic signals received from the electronic system. Receiver circuitry can be included for processing the signals produced by the photodiode and providing output signals to the electronic system. Optical lenses are also commonly included.

Generally, there are two types of semiconductor laser devices: edge-emitting lasers and Vertical Cavity Surface Emitting Lasers (VCSELs). An advantage of VCSELs is that they can be tested economically at wafer level rather than chip level. Another advantage of VCSELs is their well-defined spot size, which promotes high coupling efficiency to optical fibers without the need to provide beam shape correction, thus facilitating economical packaging. Edge-emitting lasers also have advantages, such as robust reliability and high output optical power. Likely for these reasons, edge-emitting lasers remain the most commonly used semiconductor laser in high-speed optical transceivers. To test edge-emitting lasers, a wafer must be scribed and cleaved for single-chip testing. That is, wafers must be diced into bars, coated with highly-reflective (HR) or anti-reflective (AR) coatings, and then diced to single chips to be tested and selected. The process of testing edge-emitting lasers thus can be relatively uneconomical.

One way to reduce edge-emitting laser chip cost involves a process commonly referred to as etched facet. In an etched facet laser, the feedback mirrors are etched facets rather than cleaved facets. Etched facets facilitate coating the facet with highly reflective or, alternatively, anti-reflective layers at wafer-level, rather than at bar level. (See, e.g., Peter Vettiger et al., IEEE Journal of Quantum Electronics, Vol. 27(6), June 1991, p. 1319.) A minor-like etching profile is necessary to minimize reflection loss and provide a uniform coating thickness.

Edge-emitting lasers can have either a ridge waveguide structure or a buried waveguide structure. The process of fabricating a ridge waveguide structure is less complex than the process of fabricating a buried waveguide structure. For uncooled lasers, the active core layers are commonly made of aluminum-containing multiple quantum well (MQW) layers. In such a laser, a ridge waveguide structure is more advantageous than a buried waveguide structure because a ridge waveguide structure does not have an etched MQW region or suffer from aluminum oxidation.

The facets in an etched-facet laser are commonly etched by an inductively coupled plasma (ICP) process using a protection mask. This process is carried out after the formation of the waveguide. However, the presence of the ridge in such a ridge waveguide structure introduces two main difficulties for fabricating such a laser: facet quality and facet coating.

With regard to the issue of facet quality in fabricating ridge waveguide lasers, it is almost impossible to have a smooth mirror-like etch profile on a ridge waveguide structure because the mask edge in the ICP process is disturbed by the non-planar ridge structure. The quality of facets produced in the ICP process depends strongly on mask profile. In S. C. Host, et al., "High-reflectance dielectric mirrors deposited by Plasma-Enhanced Chemical Vapor Deposition on GaAs—AlGaAs Semiconductor Lasers with Inductively Coupled Plasma Etched Facets," IEEE Photonics technology Letters, VOL. 12 (10), October 2000, p 1325-1327, a Benzocyclobuten (BCB) layer was used to first planarize the ridge, and then an SiO2 mask was deposited and defined on the BCB layer.

A key feature of the above-described process is a BCB etch-back process that transfers a non-planar ridge to a planar surface. However, the process is rather complicated and time-consuming, requiring a number of steps: BCB coating, thermal curing, and BCB etch-back, followed by SiO2 layer deposition, photolithography, SiO2 dry etch, ICP etch, and lastly removal of the BCB coating. It is difficult to provide a vertical mask profile such that the ICP etch process results in a vertical ridge profile. Furthermore, the removal of BCB residue can be problematic.

The other major issue in fabricating etched facet lasers with ridge waveguide relates to facet coating. For proper laser operation, either a highly reflective (HR) coating for Fabry-Perot (FP) lasers or an anti-reflective (AR) coating for Distributed Feedback (DFB) lasers must be applied. Such coatings are commonly applied by depositing SiO2/SiNx pairs on an entire wafer by a conventional Plasma-Enhanced Chemical Vapor Deposition (PECVD) system. However, the non-planar ridge structure causes a "shadowing effect," which inhibits precise control of coating layer thickness near the ridge.

As illustrated in FIGS. 1-3 (not to scale), a known ridge waveguide laser structure 10 includes etched windows 12 fabricated directly on the structure using a protection mask (not shown). The term "window" refers to a region etched down from the surface to the substrate. The facets defined by windows 12 are coated with either an HR or AR coating material, depending on whether the resulting structure is to be a FP laser or DFB laser. (For purposes of clarity, the relatively thin coating is not separately illustrated in the drawings.) In this fabrication process, the "shadowing effect" of the ridge structure 14 commonly adversely impacts mask definition, ICP etch, and facet coating.

Multi-mask layers (not shown) are commonly used to fabricate a structure such as ridge structure 14. The first mask, which can be a BCB layer, is used with an etch-back process to planarize the ridge. Then, an SiO2 mask is deposited on the BCB surface. However, such a double mask hampers providing a vertical mask profile, which is fundamental to obtaining a vertical etch profile using the ICP process. Furthermore, such a multi-mask process is rather complicated and time-consuming, involving a number of steps: BCB coating, thermal curing, etch-back, SiO2 deposition on BCB, photolithography, RIE SiO2 etch, BCB etch, ICP semiconductor etch, SiO2 removal, and BCB removal. The last step, i.e. removing the BCB layer, is often not completely effective, thus leaving BCB residues that hamper SiO2 or metal adhesion.

It would be desirable to provide a ridge semiconductor laser with high facet quality facet and stable facet coating yield.

SUMMARY

Embodiments of the present invention relate to an edge-emitting etched-facet optical semiconductor structure having a substrate, an active multiple quantum well (MQW) region formed on the substrate, and a ridge waveguide formed over the MQW region extending in substantially a longitudinal direction between a waveguide first etched end facet and a waveguide second etched end facet, where the waveguide first etched end facet is disposed in a first window, and the waveguide second etched end facet is disposed in a second window. The first and second windows extend in a depth direction from the ridge waveguide to the substrate and through the active MQW region. The first window has a first window pair of alcoves, and the second window has a second window pair of alcoves. The waveguide first etched end facet extends between the first window pair of alcoves, and the waveguide second etched end facet extends between the second window pair of alcoves. The waveguide first and second etched end facets have optical coatings, such as HR or AR coatings.

Embodiments of the present invention further relate to a method for fabricating the edge-emitting optical semiconductor device. The method includes forming an active MQW region on a substrate, forming a first mask over the MQW region to define a ridge waveguide region, forming a ridge waveguide corresponding to the ridge waveguide region, forming a second mask over the ridge waveguide, removing portions of the MQW region and substrate, removing the second mask, and coating the resulting facets. The first mask defines a ridge waveguide region extending in substantially a longitudinal direction between a waveguide first end and a waveguide second end. The second mask defines a generally H-shaped region, a first pair of alcove regions, and a second pair of alcove regions. Removing portions of the MQW region and substrate produces a generally H-shaped window, a first pair of alcoves corresponding to the first pair of alcove regions, and a second pair of alcoves corresponding to the second pair of alcove regions. The H-shaped window extends in a depth direction from the ridge waveguide to the substrate and through the active MQW region.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
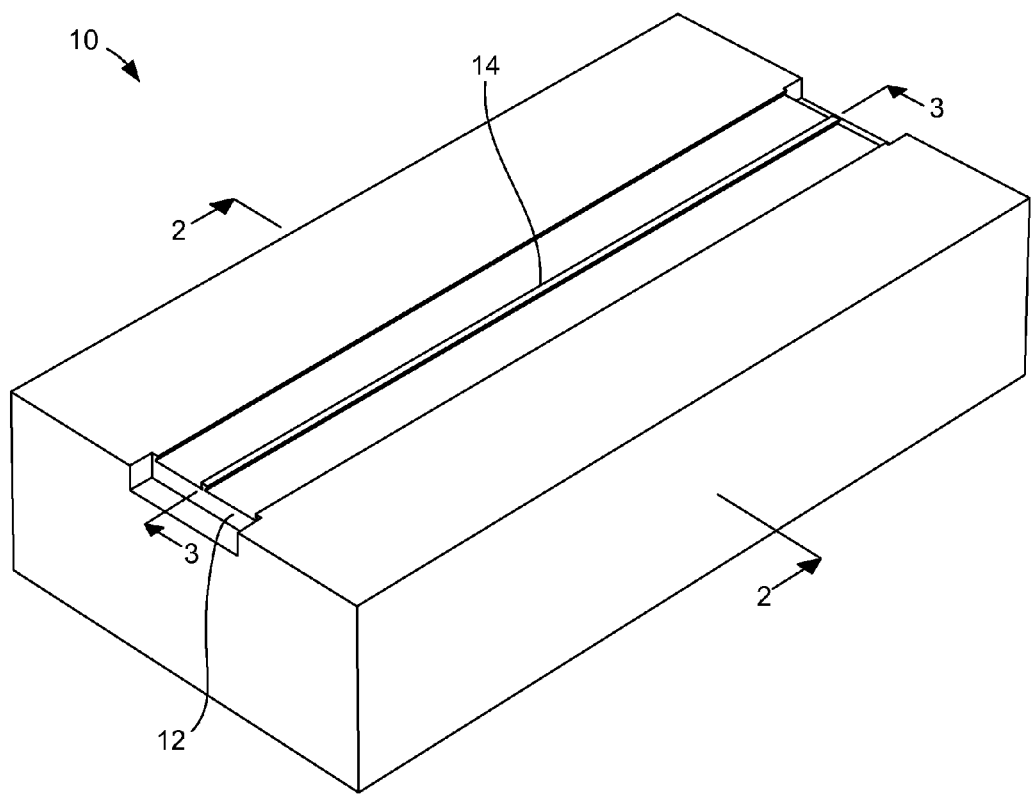
FIG. 1 is a schematic perspective view of an etched-facet ridge waveguide laser structure in accordance with the prior art.
Figure 2:
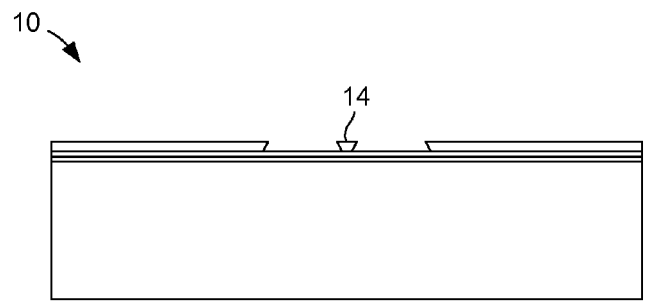
FIG. 2 is a sectional view along line 2-2 of FIG. 1.
Figure 3:
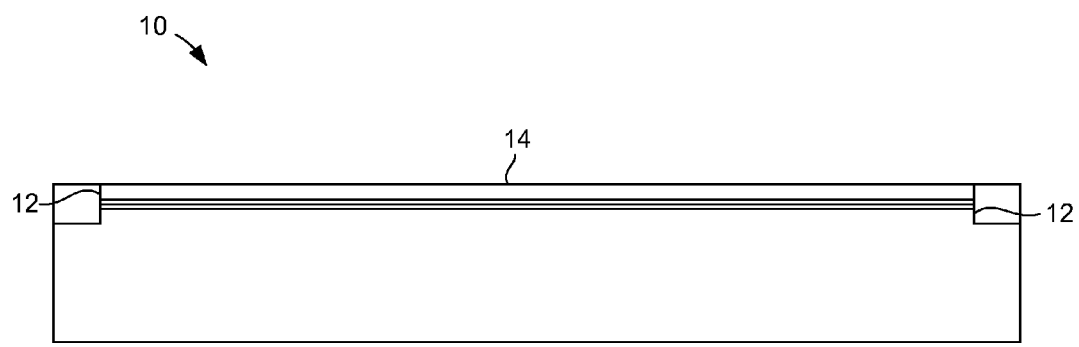
FIG. 3 is a sectional view along line 3-3 of FIG. 1.
Figure 4:
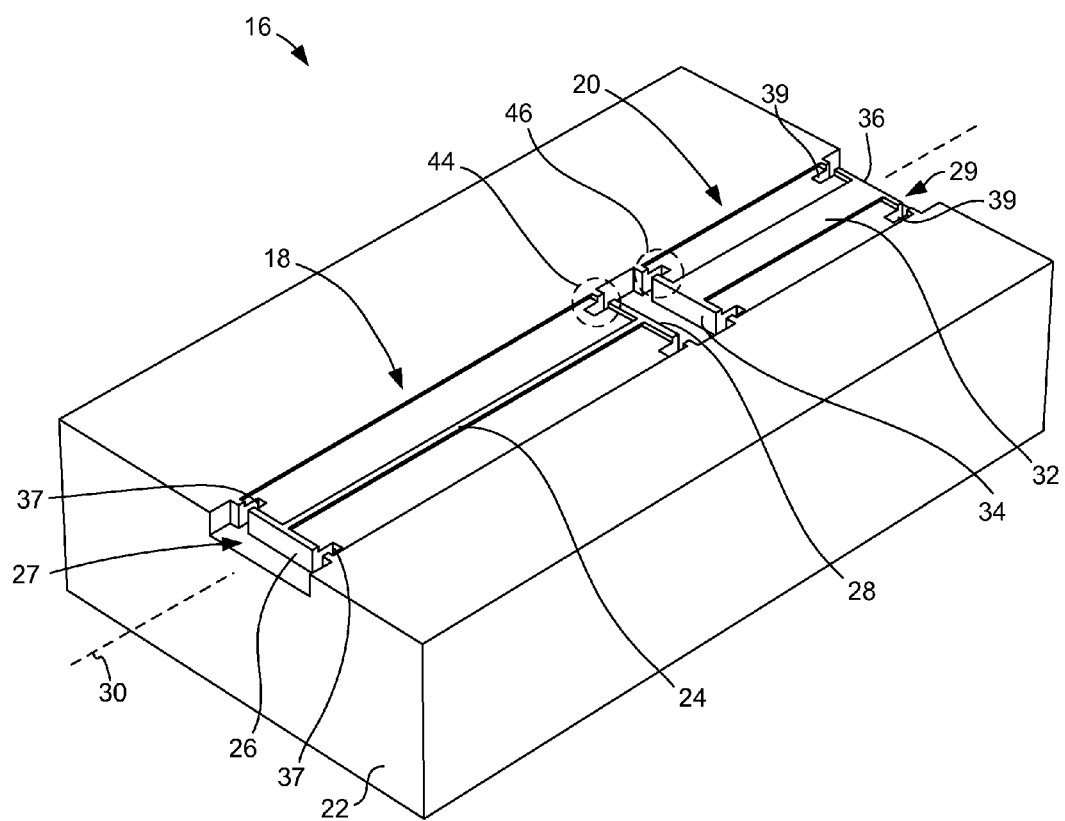
FIG. 4 is a schematic perspective view of an etched-facet integrated device structure in accordance with a first exemplary embodiment of the present invention.
Figure 5:
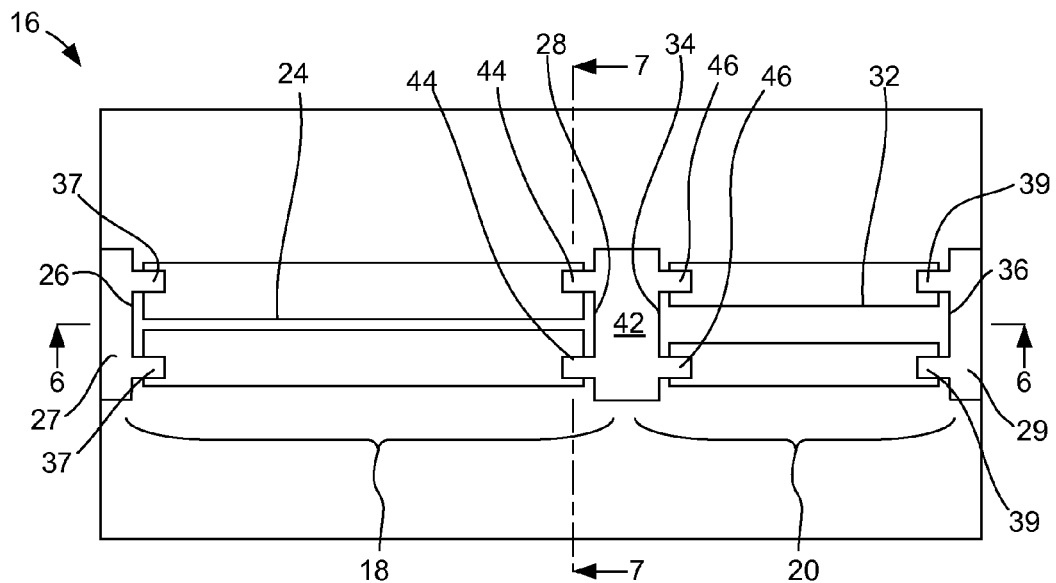
FIG. 5 is a top plan view of the etched-facet integrated device structure of FIG. 4.

As illustrated in FIGS. 4-7 (not to scale), in an illustrative or exemplary embodiment of the invention, an etched-facet edge-emitting integrated optical semiconductor structure 16 includes a first waveguide portion 18 and a second waveguide portion 20. The term "integrated" as used in this manner refers to the presence of both first waveguide portion 18 and adjoining second waveguide portion 20 in this exemplary embodiment. However, as described below, in other embodiments such a first waveguide portion and adjoining second waveguide portion can be separated from each other, and one or both portions can be used individually as an edge-emitting single-device optical semiconductor structure. An edge-emitting laser is an example of such a single-device optical semiconductor structure. Also, although for purposes of clarity only two adjoining waveguide portions are described in the following exemplary embodiments, it should be understood that many such adjoining waveguide portions can be formed on a semiconductor wafer and then separated from one another.

In a manner described below, first waveguide portion 18 and second waveguide portion 20 are formed on a semiconductor substrate 22 in an orientation parallel to a major plane of substrate 22. First waveguide portion 18 includes a first ridge waveguide 24. First waveguide portion 18 further includes a first etched end facet 26 in a first window 27 at a first end of first waveguide portion 18 and a second etched end facet 28 in a second window 42 at a second end of first waveguide portion 18. First ridge waveguide 24 extends between the first and second ends of first waveguide portion 18 in a direction generally aligned with a longitudinal axis 30. The distance that first ridge waveguide 24 extends in this direction is referred to herein as its "length." The term "width" refers to a direction perpendicular to length. Note that first and second etched end facets 26 and 28 of first waveguide portion 18, which serve as end waveguides, are wider than first ridge waveguide 24. Similarly, second waveguide portion 20 includes a second ridge waveguide 32. Second waveguide portion 20 further includes a first etched end facet 34 in second window 42 at a first end of second waveguide portion 20 and a second etched end facet 36 in a third window 29 at a second end of second waveguide portion 20. Second ridge waveguide 32 extends between the first and second ends of second waveguide portion 20 in a direction generally aligned with longitudinal axis 30. Note that first and second etched end facets 34 and 36 of second waveguide portion 20, which serve as end waveguides, are wider than second ridge waveguide 32. First and second etched end facets 26 and 28 of first waveguide portion 18 and first and second etched end facets 34 and 36 of second waveguide portion 20 are all coated with an optical coating, such as an HR coating or an AR coating.

With the above-described arrangement, the etched facet window is on a planar surface instead of on a reverse ridge. This enables a vertical etching profile using a SiO2 mask. A vertical etching profile is important to enable a laser device to supply optical feedback. Also, by avoiding a ridge "shadowing effect," deposition of the coating layers can be easily controlled.

Figure 6:
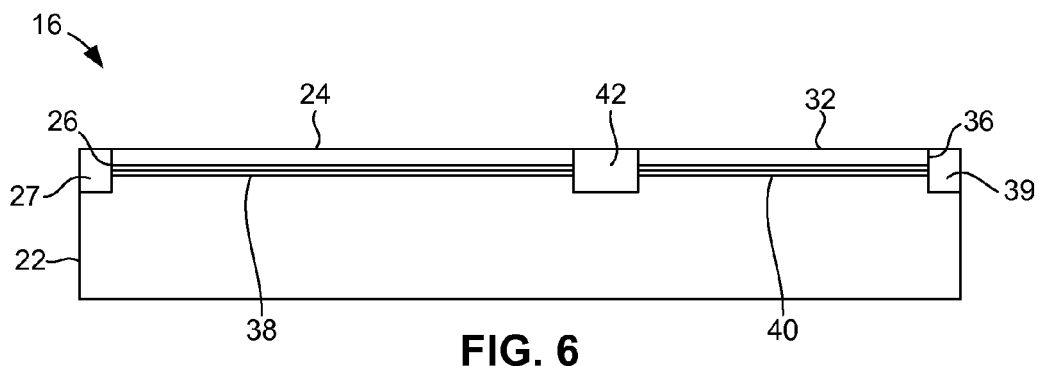
FIG. 6 is a sectional view along line 6-6 of FIG. 5.
Figure 7:
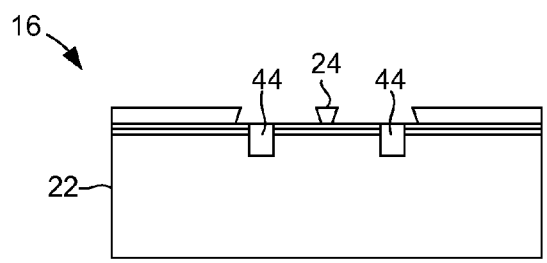
FIG. 7 is a sectional view along line 7-7 of FIG. 5.

Note in FIGS. 6-7 that first and second ridge waveguides 24 and 32 are formed above one or more multiple quantum well (MQW) layers 38 and 40. Although MQW layers 38 and 40 are described individually for purposes of clarity, they can be portions or regions of the same layer structure. When semiconductor structure 16 is in operation, MQW layers 38 and 40 act as active layers to produce gain or absorption according to device functionality, as well understood by persons skilled in the art.

Windows 27, 42 and 29 extend from ridge waveguides 24 and 32 through MQW layers 38 and 40 down to substrate 22. First window 27 includes a first window pair of alcoves 37. First etched end facet 26 of first waveguide portion 18 extends between the first window pair of alcoves 37 and thus defines the width of first etched end facet 26 of first waveguide portion 18. Second window 42 includes a second window first pair of alcoves 44 and a second window second pair of alcoves 46. Second etched end facet 28 of first waveguide portion 18 extends between the second window first pair of alcoves 44 and thus defines the width of second etched end facet 28 of first waveguide portion 18. First etched end facet 34 of second waveguide portion 20 extends between the second window second pair of alcoves 46 and thus defines the width of first etched end facet 34 of second waveguide portion 20. It can be noted the second window first pair of alcoves 44 and second window second pair of alcoves 46, which are disposed generally opposite the second window first pair of alcoves 44, together provide second window 42 with a shape resembling the letter "H". Second etched end facet 28 of first waveguide portion 18 is disposed across from or opposite first etched end facet 34 of second waveguide portion 20 within the H-shaped second window 42. Third window 29 includes a third window pair of alcoves 39. Second etched end facet 36 of second waveguide portion 20 extends between the third window pair of alcoves 39 and thus defines the width of second etched end facet 36 of second waveguide portion 20.

The function of each alcove pair is to define a wide end ridge thus to have a broadened spot-size to reduce the possibility of catastrophic optical damage on a facet. On the other hand, the alcoves together with the whole facet window provide an effective isolation of MQWs for each chip, thus making possible on-wafer measurement.

Figure 8:
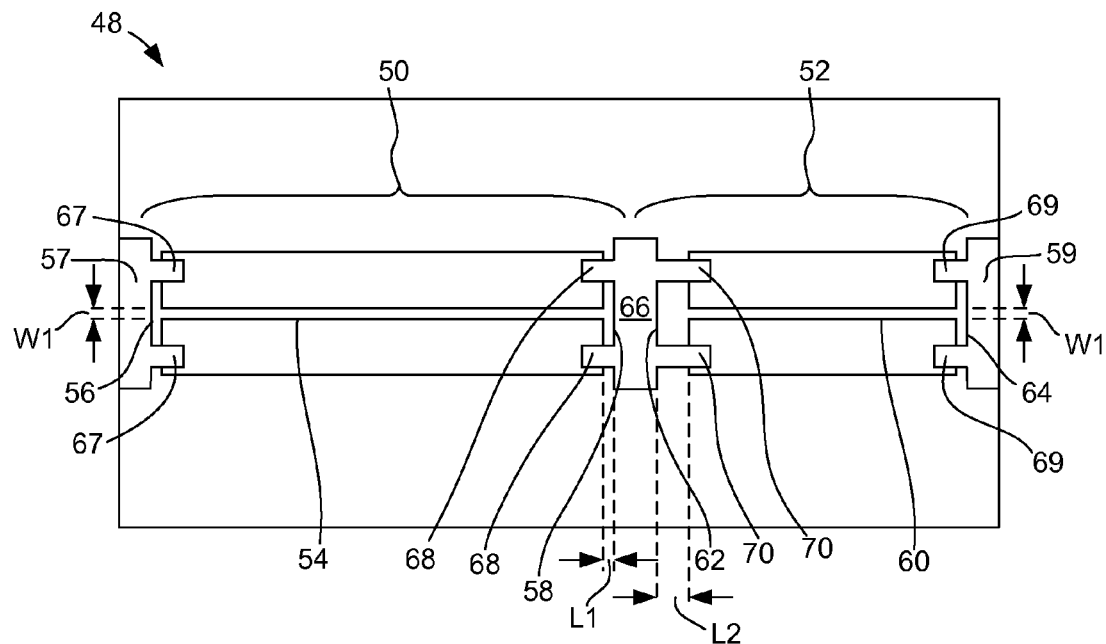
FIG. 8 is a schematic top plan view of an etched-facet integrated device structure in accordance with a second exemplary embodiment of the present invention.

As illustrated in FIG. 8 (not to scale), in a second illustrative or exemplary embodiment, an edge-emitting optical semiconductor structure 48 includes a first waveguide portion 50 and a second waveguide portion 52. Except for aspects that may be specifically described below, edge-emitting optical semiconductor structure 48 is similar to the above-described edge-emitting optical semiconductor structure 16. Accordingly, aspects of edge-emitting optical semiconductor structure 48 that are similar to those of the above-described edge-emitting optical semiconductor structure 16 are not described again with respect to this embodiment. First waveguide portion 50 includes a first ridge waveguide 54. First waveguide portion 50 further includes a first etched end facet 56 in a first window 57 at a first end of first waveguide portion 50 and a second etched end facet 58 in a second window 66 at a second end of first waveguide portion 50. First ridge waveguide 54 extends between the first and second ends of first waveguide portion 50 in a direction generally aligned with a longitudinal axis (not shown in FIG. 8 for purposes of clarity). Similarly, second waveguide portion 52 includes a second ridge waveguide 60. Second waveguide portion 52 further includes a first etched end facet 62 in second window 66 at a first end of second waveguide portion 52 and a second etched end facet 64 in a third window 59 at a second end of second waveguide portion 52. Second ridge waveguide 60 extends between the first and second ends of second waveguide portion 52 in a direction generally aligned with the longitudinal axis. Although not shown in FIG. 8 for purposes of clarity, first and second ridge waveguides 54 and 60 are formed above one or more MQW layers, which are in turn formed on the substrate. First and second etched end facets 56 and 58 of first waveguide portion 50 and first and second etched end facets 62 and 64 of second waveguide portion 52 are all coated with an optical coating, such as a HR coating or an AR coating.

Windows 57, 66 and 59 extend from ridge waveguides 54 and 60 through MQW layers (not shown for purposes of clarity) down to the substrate. First window 57 includes a first window pair of alcoves 67. First etched end facet 56 of first waveguide portion 50 extends between the first window pair of alcoves 67 and thus defines the width of first etched end facet 56 of first waveguide portion 50. Second window 66 includes a second window first pair of alcoves 68 and a second window second pair of alcoves 70. Second etched end facet 58 of first waveguide portion 50 extends between the second window first pair of alcoves 68 and thus defines the width of second etched end facet 58 of first waveguide portion 50. First etched end facet 62 of second waveguide portion 52 extends between the second window second pair of alcoves 70 and thus defines the width of first etched end facet 62 of second waveguide portion 52. It can be noted the second window first pair of alcoves 68 and second window second pair of alcoves 70, which are disposed generally opposite the second window first pair of alcoves 68, together provide second window 66 with a shape resembling the letter "H". Second etched end facet 58 of first waveguide portion 50 is disposed across from or opposite first etched end facet 62 of second waveguide portion 52 within the H-shaped second window 66. Third window 59 includes a third window pair of alcoves 69. Second etched end facet 64 of second waveguide portion 52 extends between the third window pair of alcoves 69 and thus defines the width of second etched end facet 64 of second waveguide portion 52.

Note in FIG. 8 that the width ("W1") of first ridge waveguide 54 is equal to the width ("W2") of second ridge waveguide 60. Also note in FIG. 8 that the length or thickness ("L1") of second etched end facet 58 of first waveguide portion 50 is less than the length or thickness ("L2") of first etched end facet 62 of second waveguide portion 52, illustrating that these dimensions can be equal to each other in some embodiments and different from each other in other embodiments.

Figure 9:
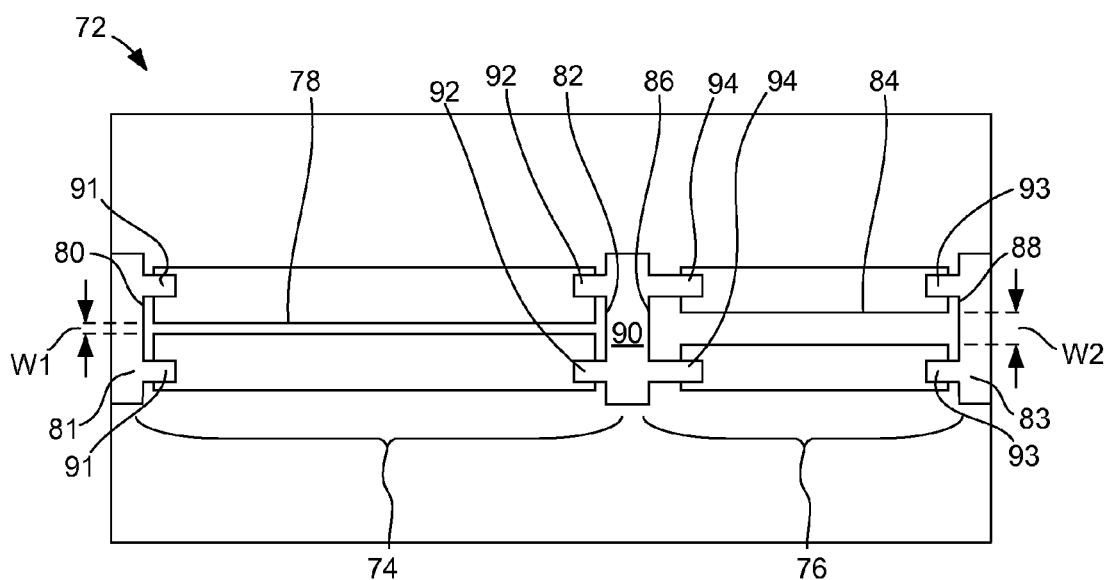
FIG. 9 is a schematic top plan view of an etched-facet integrated device structure in accordance with a third exemplary embodiment of the present invention.

As illustrated in FIG. 9 (not to scale), in a third illustrative or exemplary embodiment, an edge-emitting optical semiconductor structure 72 includes a first waveguide portion 74 and a second waveguide portion 76. Except for aspects that may be specifically described below, edge-emitting optical semiconductor structure 72 is similar to the other above-described embodiments. Accordingly, aspects of edge-emitting optical semiconductor structure 72 that are similar to those of the above-described embodiments are not described again with respect to this embodiment. First waveguide portion 74 includes a first ridge waveguide 78. First waveguide portion 74 further includes a first etched end facet 80 in a first window 81 at a first end of first waveguide portion 74 and a second etched end facet 82 in a second window 90 at a second end of first waveguide portion 74. First ridge waveguide 78 extends between the first and second ends of first waveguide portion 74 in a direction generally aligned with a longitudinal axis (not shown in FIG. 9 for purposes of clarity). Similarly, second waveguide portion 76 includes a second ridge waveguide 84. Second waveguide portion 76 further includes a first etched end facet 86 in second window 90 at a first end of second waveguide portion 76 and a second etched end facet 88 in a third window 88 at a second end of second waveguide portion 76. Second ridge waveguide 84 extends between the first and second ends of second waveguide portion 76 in a direction generally aligned with the longitudinal axis. Although not shown in FIG. 9 for purposes of clarity, first and second ridge waveguides 78 and 84 are formed above one or more MQW layers, which are in turn formed on the substrate. First and second etched end facets 80 and 82 of first waveguide portion 74 and first and second etched end facets 86 and 88 of second waveguide portion 76 are all coated with an optical coating, such as an HR coating or an AR coating.

Windows 81, 90 and 83 extend from ridge waveguides 78 and 84 through MQW layers (not shown for purposes of clarity) down to the substrate. First window 81 includes a first window pair of alcoves 91. First etched end facet 80 of first waveguide portion 74 extends between the first window pair of alcoves 91 and thus defines the width of first etched end facet 80 of first waveguide portion 74. Second window 90 includes a second window first pair of alcoves 92 and a second window second pair of alcoves 94. Second etched end facet 82 of first waveguide portion 74 extends between the second window first pair of alcoves 92 and thus defines the width of second etched end facet 82 of first waveguide portion 74. First etched end facet 86 of second waveguide portion 76 extends between the second window second pair of alcoves 94 and thus defines the width of first etched end facet 86 of second waveguide portion 76. It can be noted the second window first pair of alcoves 92 and second window second pair of alcoves 94, which are disposed generally opposite the second window first pair of alcoves 92, together provide second window 90 with a shape resembling the letter "H". Second etched end facet 82 of first waveguide portion 74 is disposed across from or opposite first etched end facet 86 of second waveguide portion 76 within the H-shaped second window 90. Third window 83 includes a third window pair of alcoves 93. Second etched end facet 88 of second waveguide portion 76 extends between the third window pair of alcoves 93 and thus defines the width of second etched end facet 88 of second waveguide portion 76.

Note in FIG. 9 that the width ("W1") of first ridge waveguide 78 is less than the width ("W2") of second ridge waveguide 84, illustrating that these dimensions can be equal to each other in some embodiments and different from each other in other embodiments.

Figure 10:
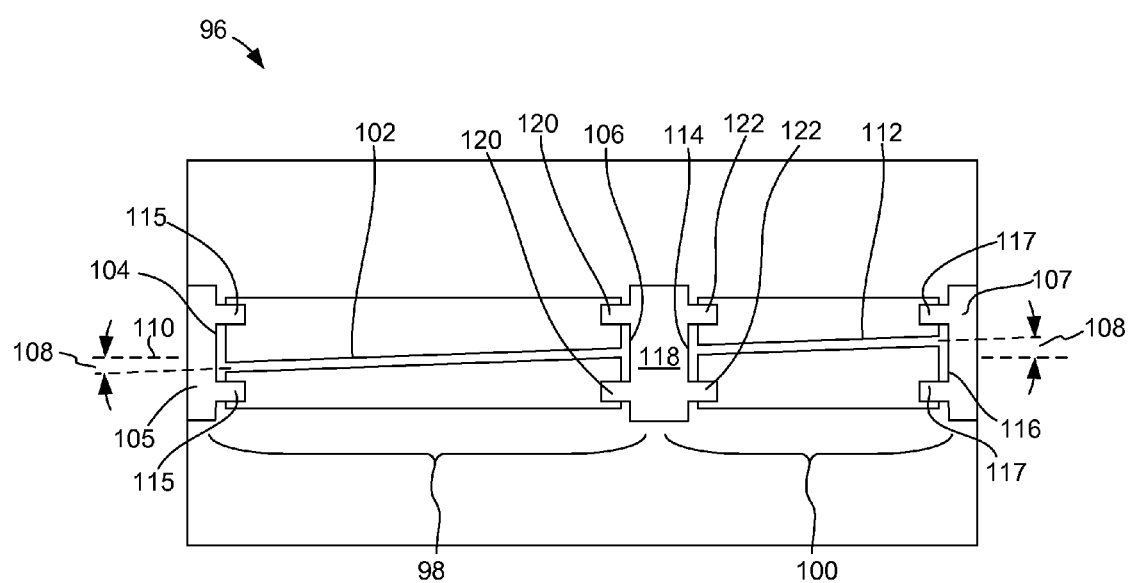
FIG. 10 is a schematic top plan view of an etched-facet integrated device structure in accordance with a fourth exemplary embodiment of the present invention.

As illustrated in FIG. 10 (not to scale), in a fourth illustrative or exemplary embodiment, an edge-emitting optical semiconductor structure 96 includes a first waveguide portion 98 and a second waveguide portion 100. Except for aspects that may be specifically described below, edge-emitting optical semiconductor structure 96 is similar to the other above-described embodiments. Accordingly, aspects of edge-emitting optical semiconductor structure 96 that are similar to those of the above-described embodiments are not described again with respect to this embodiment. First waveguide portion 98 includes a first ridge waveguide 102. First waveguide portion 98 further includes a first etched end facet 104 in a first window 105 at a first end of first waveguide portion 98 and a second etched end facet 106 in a second window 118 at a second end of first waveguide portion 98. First ridge waveguide 102 extends between the first and second ends of first waveguide portion 98 in a direction generally aligned with, but oriented at a small angle 108 with respect to, a longitudinal axis 110. The angle 108 can be optimized to reduce end-reflections. Similarly, second waveguide portion 100 includes a second ridge waveguide 112 that is oriented at the same angle 108 with respect to longitudinal axis 110. Second waveguide portion 100 further includes a first etched end facet 114 in second window 118 at a first end of second waveguide portion 100 and a second etched end facet 116 in a third window 107 at a second end of second waveguide portion 100. Second ridge waveguide 112 extends between the first and second ends of second waveguide portion 100 in a direction generally aligned with, but oriented at the angle 108 with respect to, longitudinal axis 110. Although not shown in FIG. 10 for purposes of clarity, first and second ridge waveguides 102 and 112 are formed above one or more MQW layers, which are in turn formed on the substrate. First and second etched end facets 104 and 106 of first waveguide portion 98 and first and second etched end facets 114 and 116 of second waveguide portion 100 are all coated with an optical coating, such as an HR coating or an AR coating.

Windows 105, 118 and 107 extend from ridge waveguides 102 and 112 through MQW layers (not shown for purposes of clarity) down to the substrate. First window 105 includes a first window pair of alcoves 115. First etched end facet 104 of first waveguide portion 98 extends between the first window pair of alcoves 115 and thus defines the width of first etched end facet 104 of first waveguide portion 98. Second window 118 includes a second window first pair of alcoves 120 and a second window second pair of alcoves 122. Second etched end facet 106 of first waveguide portion 98 extends between the second window first pair of alcoves 120 and thus defines the width of second etched end facet 106 of first waveguide portion 98. First etched end facet 114 of second waveguide portion 100 extends between the second window second pair of alcoves 122 and thus defines the width of first etched end facet 114 of second waveguide portion 100. It can be noted the second window first pair of alcoves 120 and second window second pair of alcoves 122, which are disposed generally opposite the second window first pair of alcoves 120, together provide second window 118 with a shape resembling the letter "H". Second etched end facet 106 of first waveguide portion 98 is disposed across from or opposite first etched end facet 114 of second waveguide portion 100 within the H-shaped second window 118. Third window 107 includes a third window pair of alcoves 117. Second etched end facet 116 of second waveguide portion 100 extends between the third window pair of alcoves 117 and thus defines the width of second etched end facet 116 of second waveguide portion 100. The embodiment shown in FIG. 10 can advantageously inhibit end reflection, which may be desirable in, for example, a distributed feedback (DFB) laser or a device employing electrical absorption modulation (EML).

Figure 11:
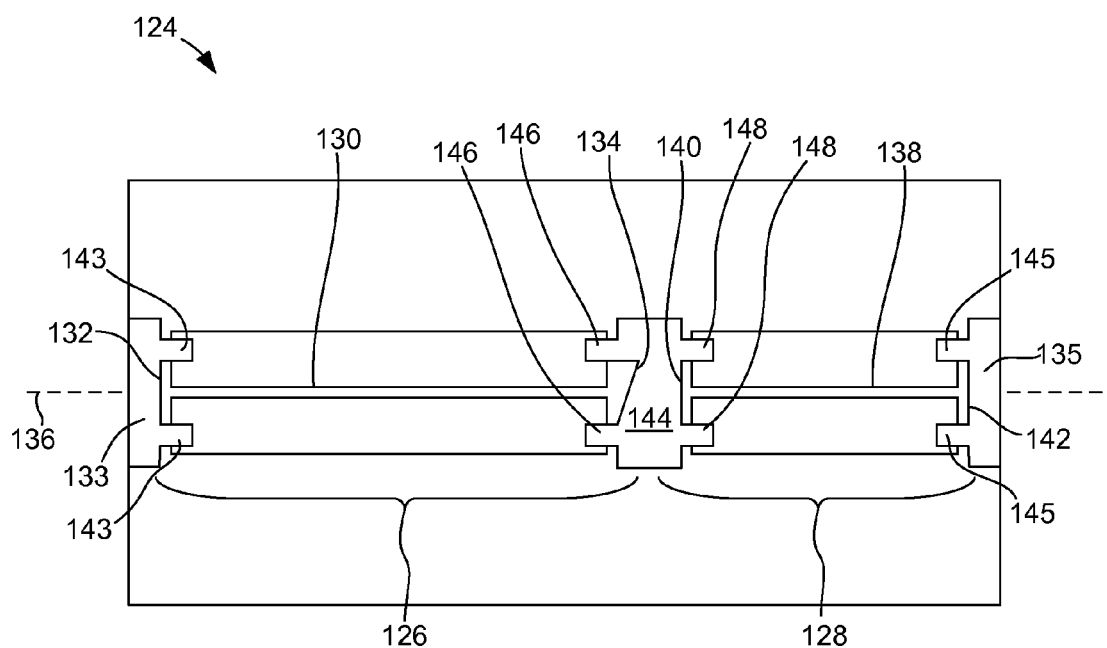
FIG. 11 is a schematic top plan view of an etched-facet integrated device structure in accordance with a fifth exemplary embodiment of the present invention.

As illustrated in FIG. 11 (not to scale), in a fifth illustrative or exemplary embodiment, an edge-emitting optical semiconductor structure 124 includes a first waveguide portion 126 and a second waveguide portion 128. Except for aspects that may be specifically described below, edge-emitting optical semiconductor structure 124 is similar to the other above-described embodiments. Accordingly, aspects of edge-emitting optical semiconductor structure 124 that are similar to those of the above-described embodiments are not described again with respect to this embodiment. First waveguide portion 126 includes a first ridge waveguide 130. First waveguide portion 126 further includes a first etched end facet 132 in a first window 133 at a first end of first waveguide portion 126 and a second etched end facet 134 in a second window 144 at a second end of first waveguide portion 126. First ridge waveguide 130 extends between the first and second ends of first waveguide portion 126 in a direction generally aligned with a longitudinal axis 136. In this embodiment, second etched end facet 134 of first waveguide portion 126 is oriented at an oblique angle (optimized to minimize end-reflections, in a range of, for example, 0-12 degrees) with respect to longitudinal axis 136. Similarly, second waveguide portion 128 includes a second ridge waveguide 138. Second waveguide portion 128 further includes a first etched end facet 140 in second window 144 at a first end of second waveguide portion 128 and a second etched end facet 142 in a third window 135 in a second end of second waveguide portion 128. Second ridge waveguide 138 extends between the first and second ends of second waveguide portion 128 in a direction generally aligned with longitudinal axis 136. Although not shown in FIG. 11 for purposes of clarity, first and second ridge waveguides 130 and 138 are formed above one or more MQW layers, which are in turn formed on the substrate. First and second etched end facets 132 and 134 of first waveguide portion 126 and first and second etched end facets 140 and 142 of second waveguide portion 128 are all coated with an optical coating, such as an HR coating or an AR coating.

Windows 133, 144 and 135 extend from ridge waveguides 130 and 138 through MQW layers (not shown for purposes of clarity) down to the substrate. First window 133 includes a first window pair of alcoves 143. First etched end facet 132 of first waveguide portion 126 extends between the first window pair of alcoves 143 and thus defines the width of first etched end facet 132 of first waveguide portion 126. Second window 144 includes a second window first pair of alcoves 146 and a second window second pair of alcoves 148. Second etched end facet 134 of first waveguide portion 126 extends between the second window first pair of alcoves 146 and thus defines the width of second etched end facet 134 of first waveguide portion 126. First etched end facet 140 of second waveguide portion 128 extends between the second window second pair of alcoves 148 and thus defines the width of first etched end facet 140 of second waveguide portion 128. It can be noted the second window first pair of alcoves 146 and second window second pair of alcoves 148, which are disposed generally opposite the second window first pair of alcoves 146, together provide second window 144 with a shape resembling the letter "H". Second etched end facet 134 of first waveguide portion 126 is disposed across from or opposite first etched end facet 140 of second waveguide portion 128 within the H-shaped second window 144. Third window 135 includes a third window pair of alcoves 145. Second etched end facet 142 of second waveguide portion 128 extends between the third window pair of alcoves 145 and thus defines the width of second etched end facet 142 of second waveguide portion 128.

Figure 12:
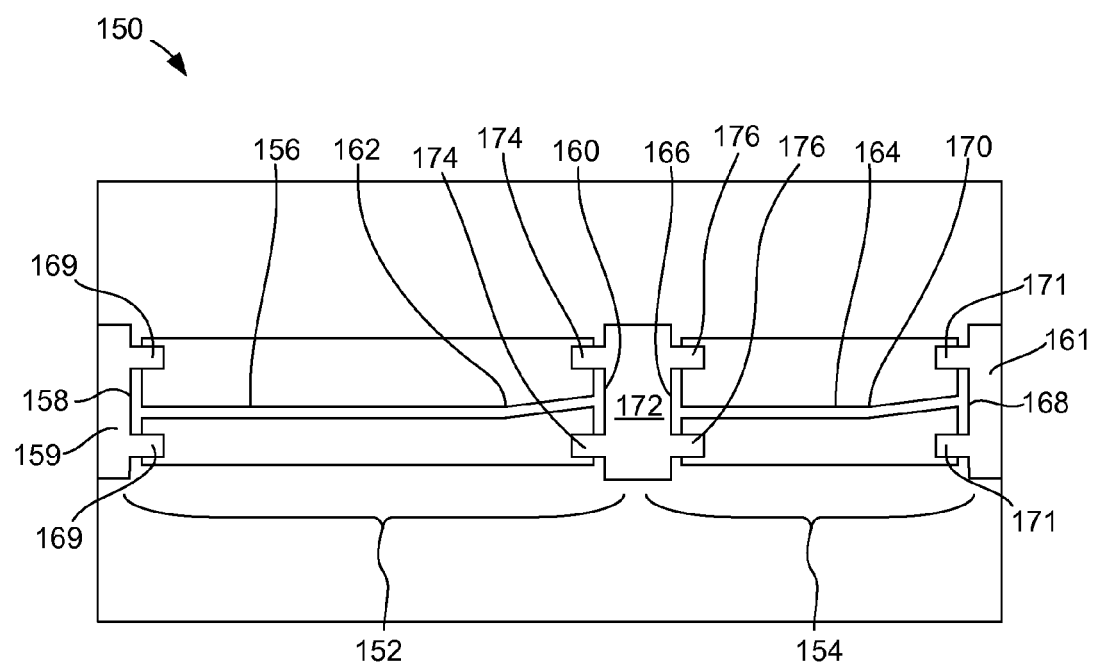
FIG. 12 is a schematic top plan view of an etched-facet integrated device structure in accordance with a sixth exemplary embodiment of the present invention.

As illustrated in FIG. 12 (not to scale), in a sixth illustrative or exemplary embodiment, an edge-emitting optical semiconductor structure 150 includes a first waveguide portion 152 and a second waveguide portion 154. Except for aspects that may be specifically described below, edge-emitting optical semiconductor structure 150 is similar to the other above-described embodiments. Accordingly, aspects of edge-emitting optical semiconductor structure 150 that are similar to those of the above-described embodiments are not described again with respect to this embodiment. First waveguide portion 152 includes a first ridge waveguide 156. First waveguide portion 152 further includes a first etched end facet 158 in a first window 159 at a first end of first waveguide portion 152 and a second etched end facet 160 in a second window 172 at a second end of first waveguide potion 152. First ridge waveguide 156 extends between the first and second ends of first waveguide portion 152 in a direction generally aligned with a longitudinal axis (not shown) but having a slight bend 162 at a point along its length. This bent waveguide can have an "adiabatic" shape to minimize optical losses and end-reflections. Similarly, second waveguide portion 154 includes a second ridge waveguide 164. Second waveguide portion 154 further includes a first etched end facet 166 in second window 172 at a first end of second waveguide portion 154 and a second etched end facet 168 in a third window 161 at a second end of second waveguide portion 154. Second ridge waveguide 164 extends between the first and second ends of second waveguide portion 154 in a direction generally aligned with the longitudinal axis (not shown) but having a slight bend 170 at a point along its length. Although not shown in FIG. 12 for purposes of clarity, first and second ridge waveguides 156 and 164 are formed above one or more MQW layers, which are in turn formed on the substrate. First and second etched end facets 158 and 160 of first waveguide portion 152 and first and second etched end facets 166 and 168 of second waveguide portion 154 are all coated with an optical coating, such as an HR coating or an AR coating.

Windows 159, 172 and 161 extend from ridge waveguides 156 and 164 through MQW layers (not shown for purposes of clarity) down to the substrate. First window 159 includes a first window pair of alcoves 169. First etched end facet 158 of first waveguide portion 152 extends between the first window pair of alcoves 169 and thus defines the width of first etched end facet 158 of first waveguide portion 152. Second window 172 includes a second window first pair of alcoves 174 and a second window second pair of alcoves 176. Second etched end facet 160 of first waveguide portion 152 extends between the second window first pair of alcoves 174 and thus defines the width of second etched end facet 160 of first waveguide portion 152. First etched end facet 166 of second waveguide portion 154 extends between the second window second pair of alcoves 176 and thus defines the width of first etched end facet 166 of second waveguide portion 154. It can be noted the second window first pair of alcoves 174 and second window second pair of alcoves 176, which are disposed generally opposite the second window first pair of alcoves 174, together provide second window 172 with a shape resembling the letter "H". Second etched end facet 160 of first waveguide portion 152 is disposed across from or opposite first etched end facet 166 of second waveguide portion 154 within the H-shaped second window 172. Third window 161 includes a third window pair of alcoves 171. Second etched end facet 168 of second waveguide portion 154 extends between the third window pair of alcoves 171 and thus defines the width of second etched end facet 168 of second waveguide portion 154.

Each of the embodiments described above with regard to FIGS. 10-12 can advantageously inhibit end reflection due to the angling of the direction of light output from the window. An AR coating can further help to inhibit end reflection.

Figure 13:
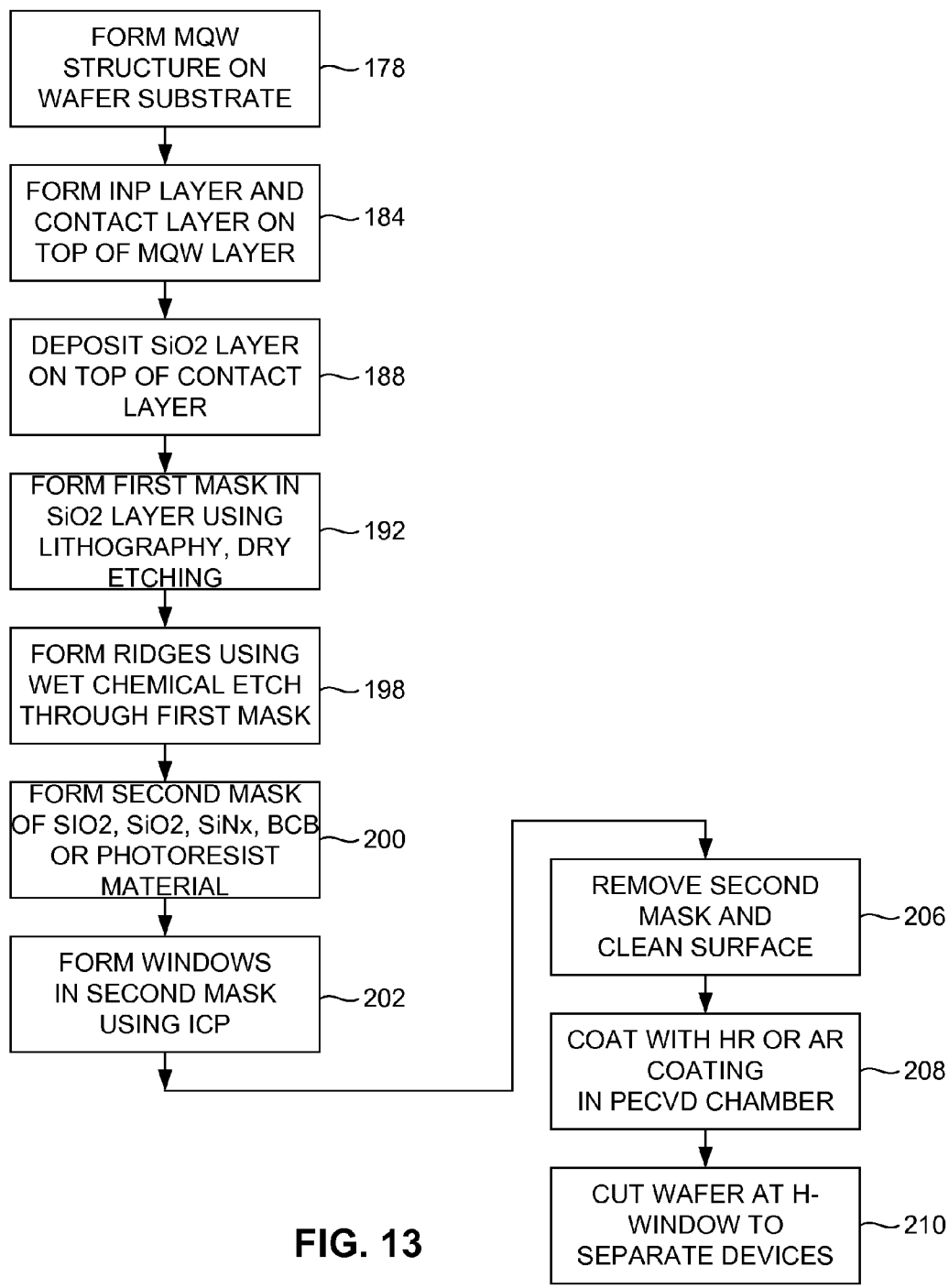
FIG. 13 is a flow diagram further illustrating the exemplary fabrication method.

A method for fabricating the above-described edge-emitting optical semiconductor structures is illustrated in FIG. 13 and described with further reference to FIGS. 14-20. Although not shown for purposes of clarity, it should be understood that the method can be performed on a semiconductor wafer having many such structures.

Figure 14:
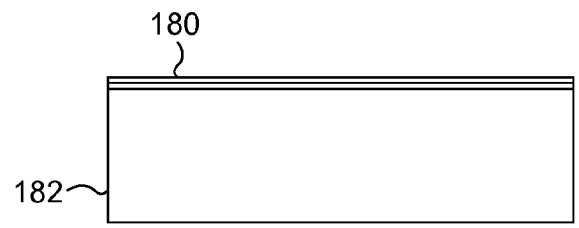
FIG. 14 illustrates a first step in an exemplary method for fabricating etched-facet integrated devices and semiconductor lasers.

As indicated by block 178, and with further reference to FIG. 14, one or more MQW layers 180 are formed on a substrate 182. Substrate 182 is made of a suitable semiconductor material such as indium phosphide (InP). Note that in an edge-emitting optical semiconductor device having first and second waveguide portions, corresponding first and second MQW regions are provided. Although InP is used in this exemplary embodiment, it should be understood that in other embodiments other materials can be used for substrate 182 or other layers, including materials such as gallium arsenide (GaAs), aluminum gallium (AlGa), aluminum gallium indium arsenide (AlGaInAs), etc. Persons skilled in the art will be readily capable of selecting suitable materials in view of the teachings herein.

Figure 15:
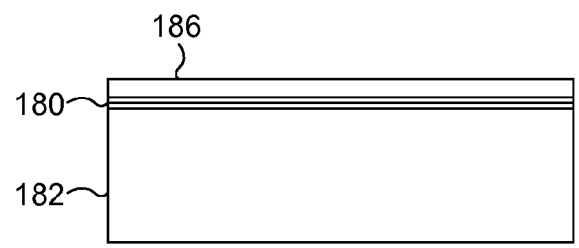
FIG. 15 illustrates a second step in the exemplary method for fabricating etched-facet integrated devices and semiconductor lasers.

As indicated by block 184, and with further reference to FIG. 15, additional layers 186 comprising, for example, InP and electrical contact material are formed over the one or more MQW layers 180. Although not separately shown for purposes of clarity, such an InP layer can be formed over the MQW layers 180, and such an electrical contact layer can be is formed over the InP layer.

Figure 16:
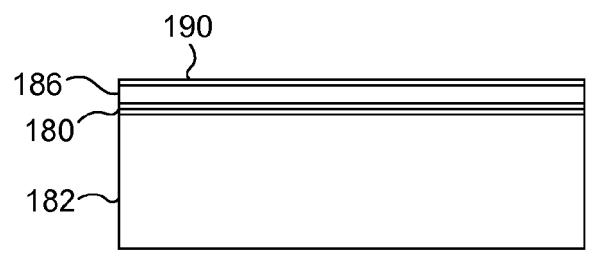
FIG. 16 illustrates a third step in the exemplary method for fabricating etched-facet integrated devices and semiconductor lasers.
Figure 17:
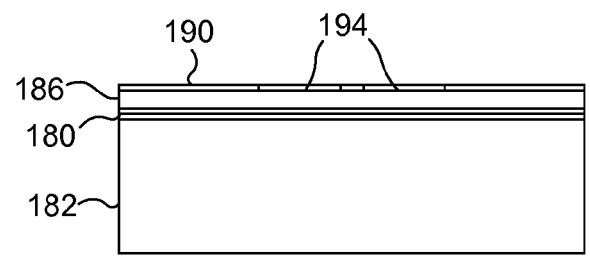
FIG. 17 illustrates a fourth step in the exemplary method for fabricating etched-facet integrated devices and semiconductor lasers.
Figure 18:
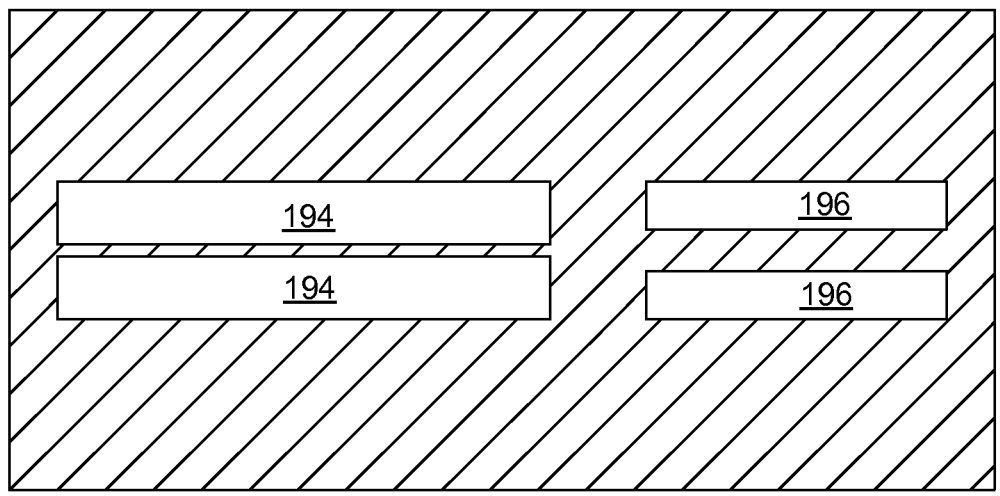
FIG. 18 is a schematic plan view showing the first mask in the exemplary fabrication method.

As indicated by block 188, and with further reference to FIG. 16, a first mask layer 190 of, for example, SiO2 is formed over the one or more MQW layers 180 and the additional InP and electrical contact layers 186. As indicated by block 192, and with further reference to FIGS. 17 and 18, a first mask is formed in first mask layer 190 by using lithography and dry-etch to remove first and second ridge waveguide regions 194 and 196. In FIG. 18, the hatched regions represent the SiO2 or other mask material, and the non-hatched regions represent openings (i.e., first and second ridge waveguide regions 194 and 196) through the first mask. The first mask thus defines first and second ridge waveguide regions 194 and 196.

Figure 19:
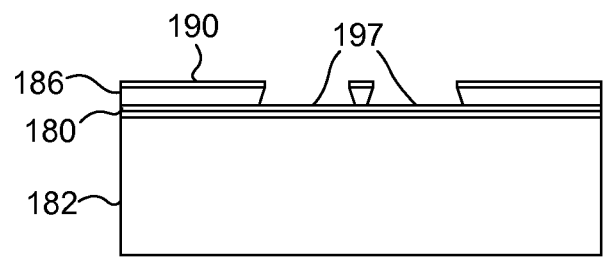
FIG. 19 illustrates a fifth step in the exemplary method for fabricating etched-facet integrated devices and semiconductor lasers.
Figure 20:
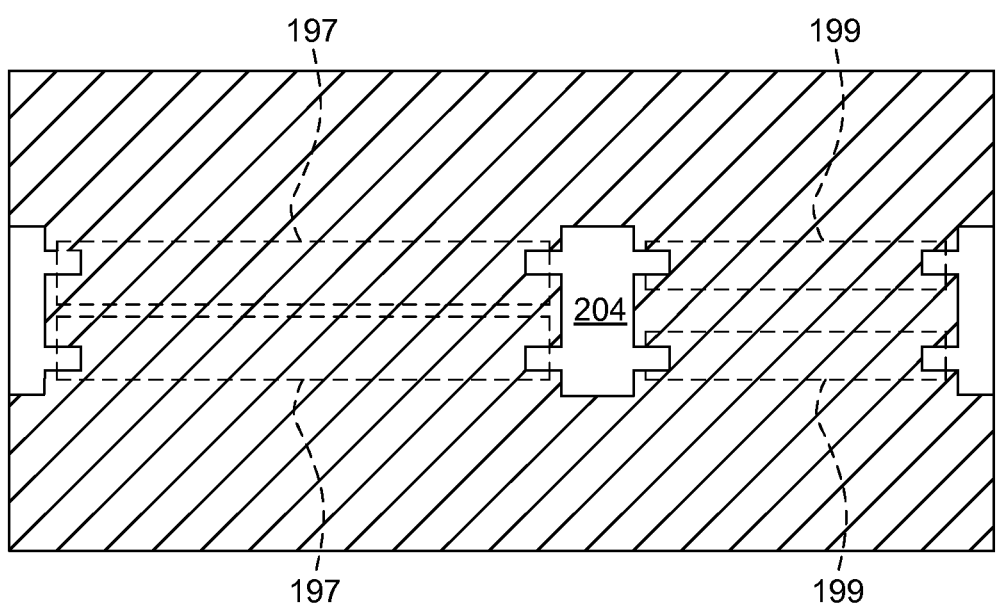
FIG. 20 illustrates a sixth step in the exemplary method for fabricating etched-facet integrated devices and semiconductor lasers.

As indicated by block 198, and with further reference to FIG. 19, a wet chemical etch can be used to etch the first mask (through first and second ridge waveguide regions 194 and 196) to form first and second ridge waveguides corresponding to the first and second ridge waveguide regions 194 and 196. The first and second ridge waveguides are delineated by pairs of recessed regions 197 and 199, respectively (FIGS. 19-20). Note that the first and second ridge waveguides are formed over the first and second MQW regions, respectively.

As indicated by block 200, and with further reference to FIG. 20, a second mask is formed by depositing a layer of a suitable mask material, such as SiO2, SiNx, BCB or photoresist material, over the resulting first and second waveguide portions. As indicated by block 202, a material removal process such as an inductively coupled plasma (ICP) process is used to remove an H-shaped region 204 (FIG. 20). In FIG. 20, the hatched regions represent the mask material, and the non-hatched regions represent H-shaped region 204 and similar regions etched by this ICP process. The ICP etching process is performed to a depth down to the substrate, such that the MQW layers, electrical contact layer, and other intervening layers in the H-shaped region 204 are removed. The minor-like etching profiles are useful to supply optical feedback for laser device. The window resulting from the ICP etching process has an "H" shape corresponding to the H-shaped window region 204. Accordingly, the resulting window has a central window region and first and second pairs of alcoves between which the etched facets extend, as described above with regard to the embodiments illustrated in FIGS. 4-12.

As illustrated by block 206, the second mask is then removed and the surface of the structure is cleaned of any remaining mask residue. As illustrated by block 208, the resulting etched facets are coated with an optical coating. For example, the structure (or wafer having many of such structures) can be placed in a Plasma-Enhanced Chemical Vapor Deposition (PECVD) chamber, and either an HR or, alternatively, an AR coating can be applied. In an embodiment in which the method is used to fabricate a Fabry-Perot laser, an HR coating can be applied with SiO2/SiNx or other dielectric multi-layer stacks. In an embodiment in which the method is used to fabricate a DFB laser, an AR coating can be applied. It should be understood that the above-described method can be used to fabricate not only Fabry-Perot lasers and DFB lasers but also any other suitable type of semiconductor laser, such as a modulator, amplifier, waveguide, or photodetector. Furthermore, the method can be used to fabricate not only lasers but any suitable integrated etched-facet device, including those described above with regard to FIGS. 4-12.

Figure 21:
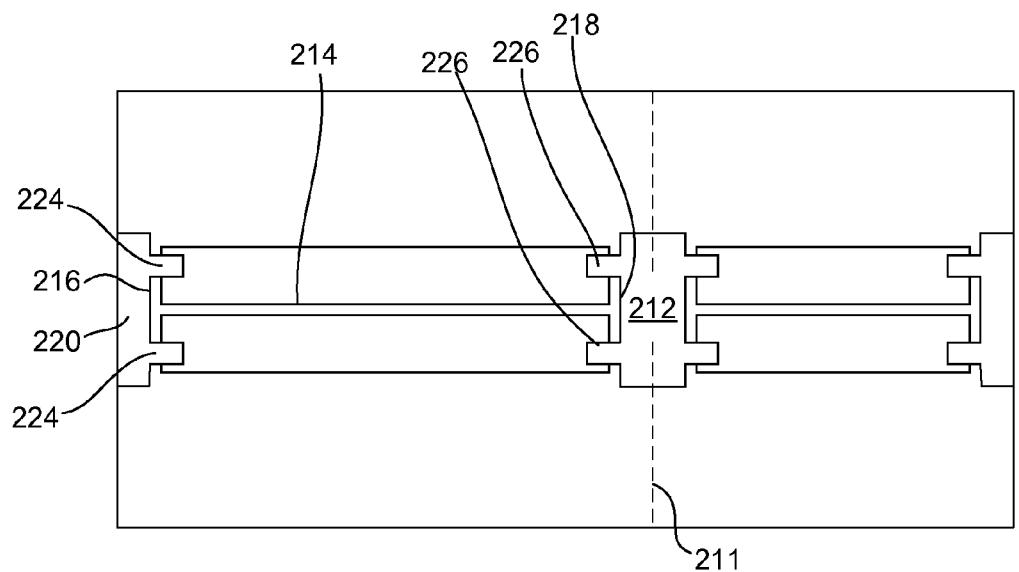
FIG. 21 is a schematic top plan view of an etched-facet single-device structure.
Figure 22:
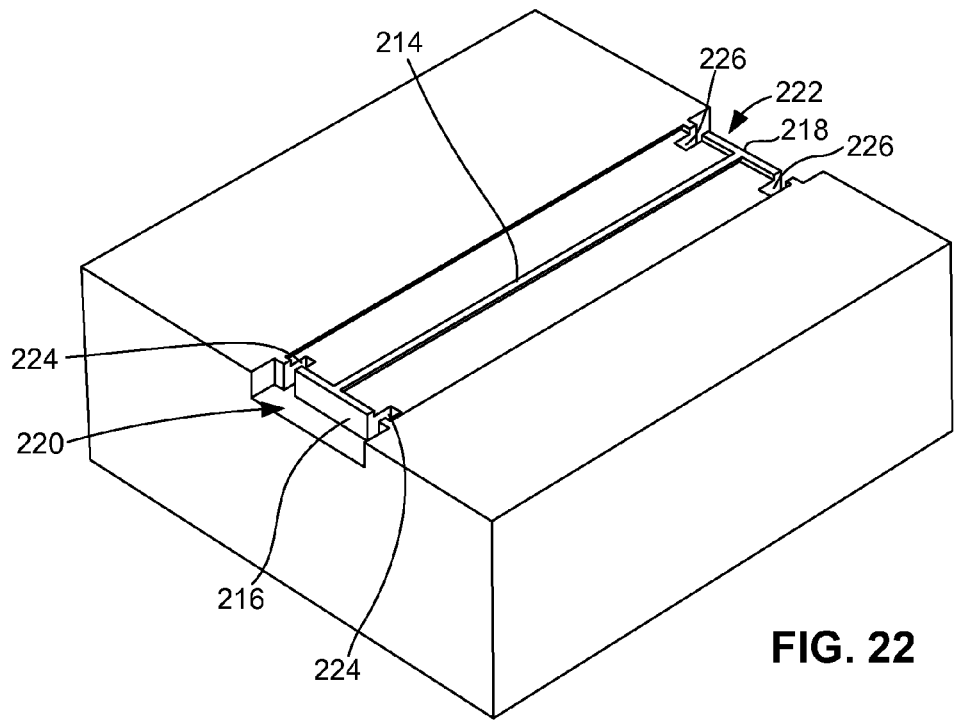
FIG. 22 is a perspective view of the etched-facet single-device structure of FIG. 21.

As illustrated by block 210, the semiconductor wafer (not shown in its entirety for purposes of clarity) can be diced to separate one or more waveguide portions from each other. An "integrated" edge-emitting optical device can be formed by leaving two waveguide portions adjoining one another as shown in, for example, FIGS. 4-12, and cutting or otherwise separating such a two-waveguide structure from all other waveguide portions on the wafer. Alternatively, a "single-device" edge-emitting optical device can be formed by separating a single waveguide portion from all other waveguide portions on the wafer, as illustrated in FIGS. 21-22. As shown in FIG. 21, two adjoining waveguide portions can be cut apart on a line 211 through the center of the second window 212. It can be noted in FIGS. 21-22 that a single-device edge-emitting optical device 210 resulting from the above-described fabrication method includes a ridge waveguide 214 extending in substantially a longitudinal direction between a first etched end facet 216 and a second etched end facet 218. The first etched end facet 216 is disposed in a first window 220, while the second etched end facet 218 is disposed in a second window 222 (corresponding to one-half of second window 212 in FIG. 21). First window 220 has a first window pair of alcoves 224, and second window 222 has a second window pair of alcoves 226. First etched end facet 216 extends between the first window pair of alcoves 224, and second etched end facet 218 extends between the second window pair of alcoves 226.

One or more illustrative embodiments of the invention have been described above. However, it is to be understood that the invention is defined by the appended claims and is not limited to the specific embodiments described.

What is claimed is:

1. An edge-emitting optical semiconductor device, comprising:
   a substrate;
   a first active multiple quantum well (MQW) region formed on the substrate; and
   a first ridge waveguide extending in substantially a longitudinal direction between a first waveguide first etched end facet and a first waveguide second etched end facet, the first ridge waveguide formed in a surface of the substrate over the first active MQW region, the first waveguide first and second etched end facets having optical coatings;
   wherein the first waveguide first etched end facet is disposed in a first window, and the first waveguide second etched end facet is disposed in a second window, the first and second windows extending in a depth direction from the first ridge waveguide to the substrate and through the first active MQW regions, the first window having a first window pair of alcoves, the first waveguide first etched end facet extending between the first window pair of alcoves, the second window having a second window first pair of alcoves, the first waveguide second etched end facet extending between the second window first pair of alcoves.

2. The edge-emitting optical semiconductor device of claim 1, further comprising:
   a second active MQW region formed on the substrate; and
   a second ridge waveguide extending in substantially the longitudinal direction between a second waveguide first etched end facet and a second waveguide second etched end facet, the second ridge waveguide formed in a surface of the substrate over the second active MQW region, the second waveguide first and second etched end facets having an optical coating;
   wherein the second waveguide first etched end facet is disposed in the second window substantially opposite the first waveguide second etched end facet, the second window has a second window second pair of alcoves, the second waveguide first etched end facet extending between the second window second pair of alcoves.

3. The edge-emitting optical semiconductor device of claim 2, wherein:
   the first ridge waveguide has a first width; and
   the second ridge waveguide has a second width substantially equal to the first width.

4. The edge-emitting optical semiconductor device of claim 2, wherein:
   the first ridge waveguide has a first width; and
   the second ridge waveguide has a second width substantially different from the first width.

5. The edge-emitting optical semiconductor device of claim 2, wherein:
   the first ridge waveguide is oriented at a first angle to a longitudinal axis extending substantially in the longitudinal direction; and
   the second ridge waveguide is oriented at a second angle to the longitudinal axis substantially equal to the first angle.

6. The edge-emitting optical semiconductor device of claim 2, wherein:
   the first waveguide second etched end facet and second waveguide first etched end facet are not parallel to each other.

7. The edge-emitting optical semiconductor device of claim 2, wherein:
   at least one of the first and second ridge waveguides has a bend therein.

8. The edge-emitting optical semiconductor device of claim 2, wherein the optical coating is a highly reflective (HR) coating.

9. The edge-emitting optical semiconductor device of claim 2, wherein the optical coating is an anti-reflective (AR) coating.

10. A method for fabricating an edge-emitting optical semiconductor device, comprising:
    forming first and second active multiple quantum well (MQW) regions on a substrate;
    forming a first mask over the first and second MQW regions, the first mask defining a first ridge waveguide region and a second ridge waveguide region, the first waveguide region extending in substantially a longitudinal direction between a first waveguide first end and a first waveguide second end, the second waveguide region extending in substantially a longitudinal direction between a second waveguide first end and a second waveguide second end;
    forming a first ridge waveguide corresponding to the first ridge waveguide region and a second ridge waveguide corresponding to the second ridge waveguide region;
    forming a second mask over the first and second ridge waveguides;
    performing a removal process to remove portions of the first and second MQW regions and substrate to produce a window having a first pair of alcoves and a second pair of alcoves opposite the first pair of alcoves, the window extending in a depth direction from the first and second ridge waveguides to the substrate and through the first and second active MQW regions, the window defining a first waveguide etched end facet at the first waveguide second end and a second waveguide etched end facet at the second waveguide first end, the first waveguide second etched end facet extending between the first pair of alcoves, the second waveguide etched end facet extending between the second pair of alcoves;
    removing the second mask; and
    coating the first waveguide second etched end facet and the second waveguide etched end facet with optical coatings.

11. The method of claim 10, wherein forming a first mask layer comprises:
    depositing a layer of SiO2; and
    performing a dry-etch lithography process.

12. The method of claim 10, wherein forming a second mask comprises:
    depositing a layer of material selected from: SiO2, SiNx, Benzocyclobuten (BCB), and photoresist; and
    performing an inductively coupled plasma (ICP) process.

13. The method of claim 10, wherein coating the first waveguide second etched end facet and the second waveguide etched end facet with optical coatings comprises coating the first waveguide second etched end facet and the second waveguide etched end facet with a highly reflective (HR) coating.

14. The method of claim 10, wherein coating the first waveguide second etched end facet and the second waveguide etched end facet with optical coatings comprises coating the first waveguide second etched end facet and the second waveguide etched end facet with an anti-reflective (AR) coating.

15. The method of claim 10, further comprising forming a second active MQW region on the semiconductor substrate, and wherein:

the first mask further defines a second ridge waveguide region extending in substantially the longitudinal direction between a second waveguide first end and a second waveguide second end, and etching the first mask further forms a second ridge waveguide corresponding to the second ridge waveguide region; and performing a removal process further defines a second waveguide etched facet in the window at the second waveguide first end, the second waveguide etched end facet extending between the second pair of alcoves.

16. The method of claim 15, wherein forming a first mask comprises forming a first mask wherein the first ridge waveguide has a first width, and the second ridge waveguide has a second width substantially equal to the first width.

17. The method of claim 15, wherein forming a first mask comprises forming a first mask wherein the first ridge waveguide has a first width, and the second ridge waveguide has a second width substantially different from the first width.

18. The method of claim 15, wherein forming a first mask comprises forming a first mask wherein the first ridge waveguide is oriented at a first angle to a longitudinal axis extending substantially in the longitudinal direction, the second ridge waveguide is oriented at a second angle to the longitudinal axis substantially equal to the first angle.

19. The method of claim 15, wherein forming a first mask comprises forming a first mask wherein the first waveguide second etched end facet and second waveguide first etched end facet are not parallel to each other.

20. The method of claim 15, wherein forming a first mask comprises forming a first mask wherein at least one of the first and second ridge waveguides has a bend therein.

* * * * *